US005697096A

United States Patent [19]
Aoki et al.

[11] Patent Number: 5,697,096
[45] Date of Patent: Dec. 9, 1997

[54] NARROW-BAND COMMUNICATION APPARATUS

[75] Inventors: Minoru Aoki, Chiba; Shuichi Katsukura, Tokyo, both of Japan

[73] Assignee: Uniden Corporation, Chiba, Japan

[21] Appl. No.: 360,879

[22] Filed: Dec. 21, 1994

[30] Foreign Application Priority Data

Nov. 15, 1994 [JP] Japan ............................ 6-280967

[51] Int. Cl.[6] ........................................... H04B 1/40
[52] U.S. Cl. .......................... 455/343; 455/89; 455/127
[58] Field of Search ....................... 455/67.1, 78, 89,
455/127, 226.1, 234.1, 234.2, 245.1, 250.1,
254, 295, 296, 343, 67.7, 226.4

[56] References Cited

U.S. PATENT DOCUMENTS

| 5,519,757 | 5/1996 | Torin ................................. 455/343 |
| 5,606,741 | 2/1997 | Yamamoto et al. ................. 455/343 |

FOREIGN PATENT DOCUMENTS

| 57-35428 | 2/1982 | Japan . |
| 57-35430 | 2/1982 | Japan . |
| 59-226525 | 12/1984 | Japan . |
| 61-131626 | 6/1986 | Japan . |
| 61-198829 | 9/1986 | Japan . |
| 61-274527 | 12/1986 | Japan . |
| 62-137927 | 6/1987 | Japan . |
| 2-72724 | 3/1990 | Japan . |
| 2-92033 | 3/1990 | Japan . |
| 2-162921 | 6/1990 | Japan . |
| 2-168742 | 6/1990 | Japan . |
| 4-818 | 1/1992 | Japan . |
| 4-177954 | 6/1992 | Japan . |
| 4-345330 | 12/1992 | Japan . |
| 5-22175 | 1/1993 | Japan . |
| 5-175873 | 7/1993 | Japan . |
| 5-191214 | 7/1993 | Japan . |
| 5-206885 | 8/1993 | Japan . |
| 5-268138 | 10/1993 | Japan . |

Primary Examiner—Reinhard J. Eisenzopf
Assistant Examiner—Thanh Le
Attorney, Agent, or Firm—Lowe, Price, LeBlanc & Becker

[57] ABSTRACT

A novel narrow-band communication apparatus comprises a digital signal processor for demodulating the output from a receiving section and outputting a modulation signal for an audio input, an electric field strength detector section for detecting electric field strength in the output from the receiving section, an indicator for indicating whether the narrow-band communication apparatus is in a receiving mode or in a transmission mode, and a power controller for controlling supply of power to, or an operating state of specified portions of, the narrow-band communication apparatus according to the output from the electric field strength detector as well as from the indicator.

4 Claims, 8 Drawing Sheets

FIG. 5A when a signal strongly affected by fading is received (a) example of the conventional technology noise and the audio signal are at the same level and it is uncomfortable in hearing (b) example of the embodiment noise is reduced and the uncomfortableness is eliminated

FIG. 5B when a signal affected by weak fading is received (a) example of the conventional technology a signal including heavy noise elements is outputted at a constant level and it is uncomfortable in hearing (b) example of the embodiment a volume of sound is reduced to an appropriate level and the noise becomes not so uncomfortable to hear

NARROW-BAND COMMUNICATION APPARATUS

This patent application is the subject of a submission under the Disclosure Document Program, which was filed thereunder by applicants on Aug. 1, 1994 and identified as Disclosure Document No. 358784 with its accompanying fee paid under the provisions of all the Rules and Regulations including 37 CFR $1.21(c).

FIELD OF THE INVENTION

The present invention relates to a narrow-band communication apparatus, and more particularly to a narrow-band communication apparatus employing digital modulation/demodulation therein wherein operation of elements constituting the apparatus, operations of which are not required, is stopped according to electric field strength detection as well as to a mode of transmitting or receiving, to effectively reduce dissipation power in the transmission system, and detection of electric field strength is also used for controlling gain in the receiving system to improve circuit efficiency as well as to provide improved characteristics of the apparatus.

Also, the present invention relates to a narrow-band communication apparatus in which malfunction in AFC due to misrecongnition of an audio signal or data for a pilot signal never occurs even if a search is executed in a state where a strong audio signal or data exists near a pilot signal when AFC is executed in a narrow-band communication apparatus, or the like, employing digital modulation/demodulation therein.

Also, the present invention relates to a narrow-band communication apparatus which reduces hearing discomfort caused by noise and enables high speed AGC operation without a receiving section being saturated when executing an AGC operation according to the measured power of a pilot signal in a narrow-band communication apparatus or the like, employing digital modulation/demodulation therein.

BACKGROUND OF THE INVENTION

Figure 6:
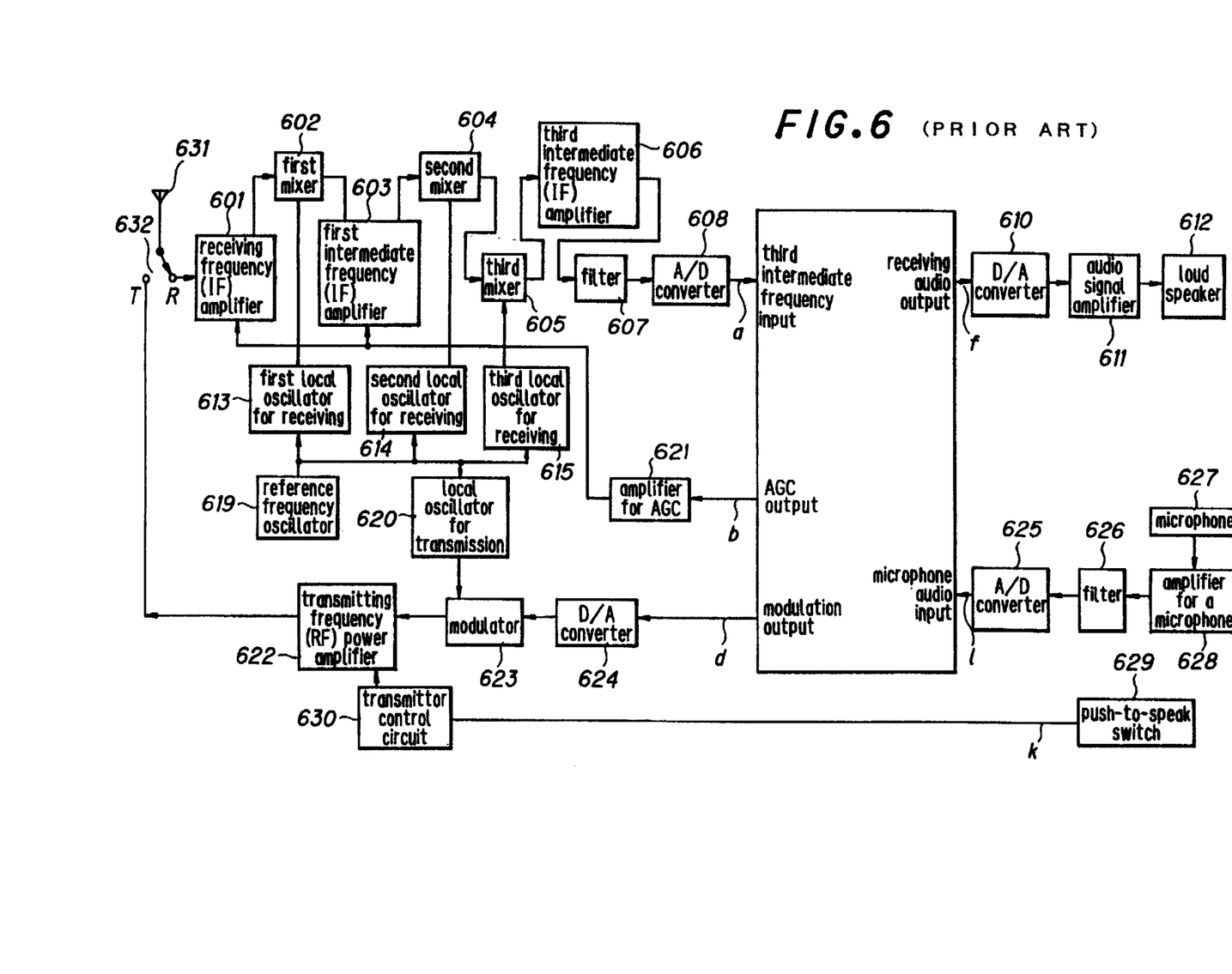
FIG. 6 is a block diagram of a conventional type of narrow-band communication apparatus.

FIG. 6 is a block diagram of a conventional type of narrow-band communication apparatus. The narrow-band communication apparatus based on the prior art employs a digital modulation technology and also employs a simplex system, and the receiving section is based on a triple super heterodyne configuration.

In FIG. 6, the conventional type of narrow-band communication apparatus largely comprises an RF and IF receiving section for a triple super heterodyne reception, a local frequency generating section for receiving, a local frequency generating section for transmission, a reference frequency generating section, a transmitting section, a signal processing section for digital modulation/demodulation, an audio output section, and a microphone audio input section.

The RF and IF receiving section for a triple super heterodyne receiver comprises a receiving frequency (RF) amplifier 601, a first mixer 602, a first intermediate frequency (IF) amplifier 603, a second mixer 604, a third mixer 605, a third intermediate frequency (IF) amplifier 606, a filter 607 and an A/D converter 608.

The local frequency generating section for receiving comprises a first local oscillator 613, a second local oscillator 614, a third local oscillator 615, and an amplifier 621 for AGC. Also the local frequency generating section is realized by a local oscillator 620 for transmission, and the reference frequency generating section is realized by a reference frequency oscillator 619.

The signal processing section for digital modulation/demodulation is realized by a transmitting/receiving digital modulator/demodulator 609 using, for instance, a DSP (Digital Signal Processor).

The audio output section comprises a D/A converter 610, an audio amplifier 611, and a loudspeaker 612. Also the microphone audio input section comprises an A/D converter 625, a filter 626, a microphone 627, and an amplifier 628 for a microphone.

The transmitting section comprises a transmission frequency (RF) power amplifier 622, a modulator 623, a D/A converter 624, a push-to-talk switch (PTT switch) 629, and a transmitter control circuit 630.

In a narrow-band communication apparatus employing digital modulation/demodulation having the configuration as described above, current in the digital signal processing section 609, A/D converter 608, D/A converter 610, and A/D converter 625 is large, and power is dissipated even though transmission or reception is not always being executed, which causes a serious problem especially in a portable terminal unit using batteries or the like.

To overcome the problems as described above, for instance, in Japanese Patent Laid-Open Publication No.345330/1992 is proposed a technique for lowering power consumption by executing so-called intermittent receiving in which a receiving system is intermittently operated, or by detecting a electric field strength and making the ON/OFF cycle longer when the detected electric field strength is weak. Another described technique disconnects power when electric field strength in a stand-by state is weak for a specified period of time.

However, the technique for lowering power consumption, as described above, is applied only to a receiving system, and in a narrow-band communication apparatus employing digital modulation/demodulation and having the configuration as described above, dissipation power in the transmission system is large as swell, and effective power saving has not been achieved. Also, detection of electric field strength has been used only for control over intermittent receiving or control of power disconnection, and efficiency of the circuit is low.

Figure 7:
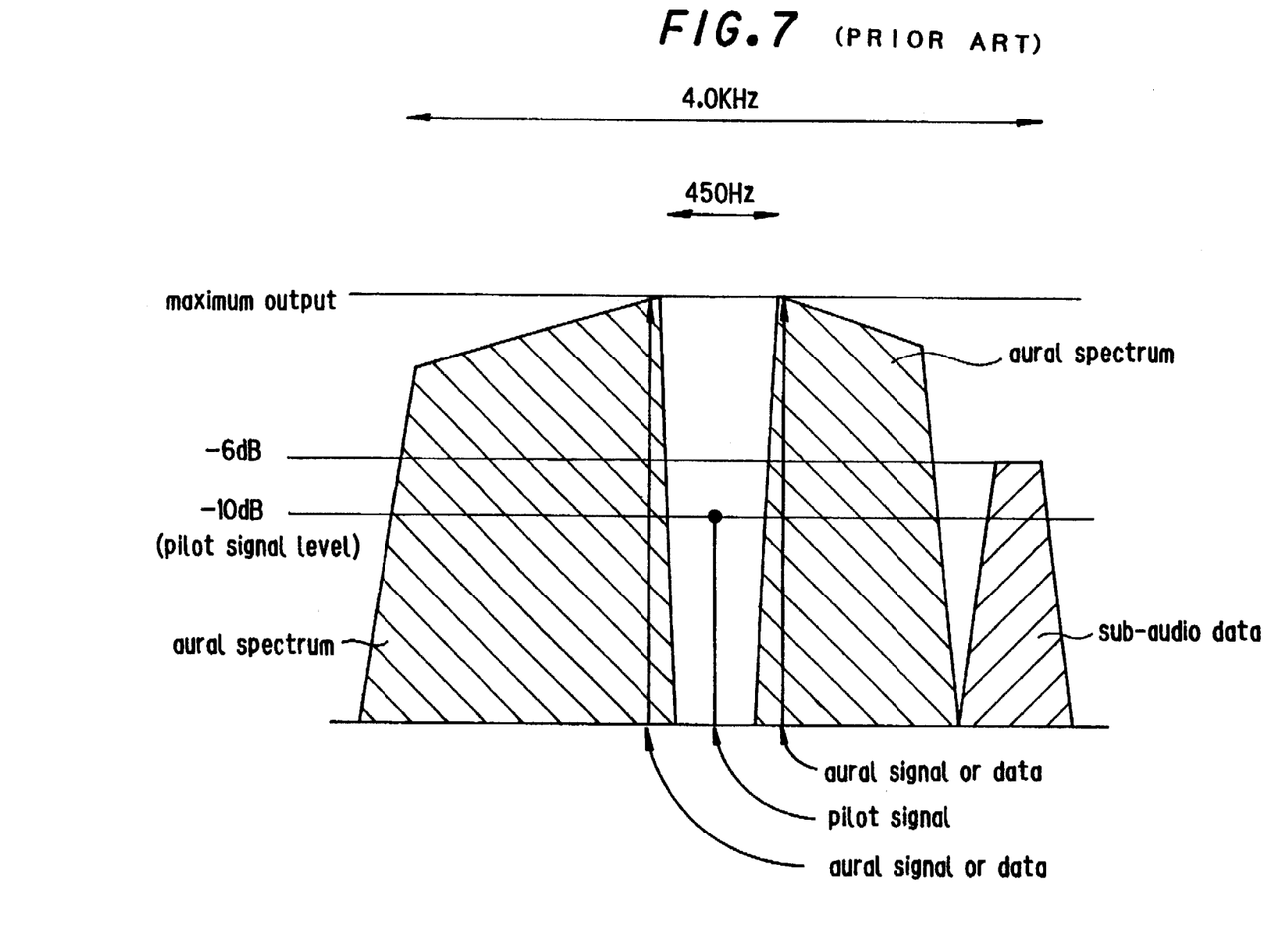
FIG. 7 is a drawing of a spectrum in a tone-in-band receiver.

Also, in the conventional type of narrow-band communication apparatus as described above, when AFC (Automatic Frequency Control) is executed, as shown in FIG. 7, a pilot signal inserted at a center of an aural signal is used to measure the frequency.

Figure 8:
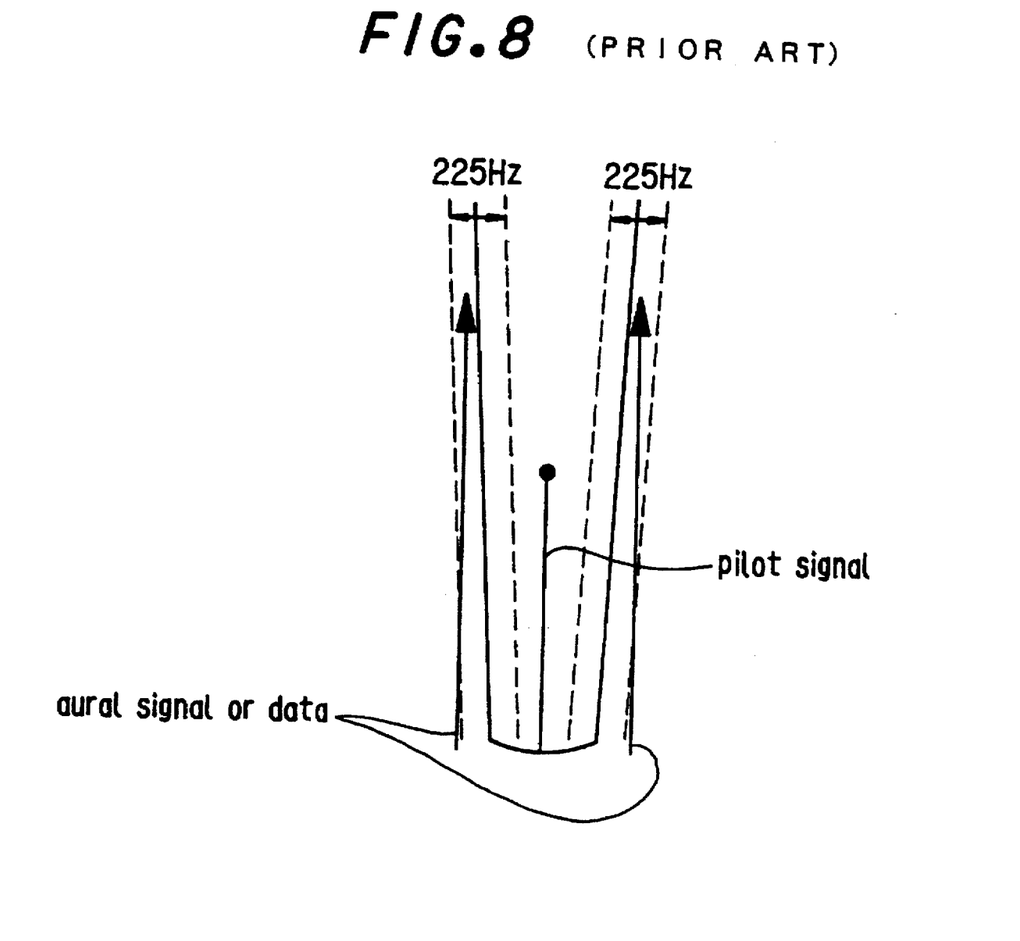
FIG. 8 is a drawing for explanation of problems in the conventional technology caused by shift of an audio signal.

The audio signal is shifted by 225 Hz respectively at a center of a band as shown in FIG. 8, and if a search is executed for AFC in a state where a strong audio signal or data exists near a pilot signal, sometimes the audio signal or data may be mistaken for a pilot signal because of a relation between a filter's bandwidth and the shift rate of an auding signal.

This problem can be solved by setting the shift rate of an audio signal to a large value, but the maximum effective band is limited to 4 KHz (in case of 220 MHz in USA), so that, if the shift rate is set to a large value, the audio signal can not be transmitted appropriately.

Also, the above problem can be solved by making the filter band for a pilot signal narrow, but then another problem occurs that timing for locking to the pilot signal becomes difficult. In brief, a finer search is required, and furthermore the response speed of the filter becomes slower, and consequently a longer time is required for searching.

In a tone-in-band receiver, generally demodulation of an audio signal is executed by referring to a pilot signal. Namely, a constant audio output can be obtained regardless of the electric field strength by measuring power P of a pilot signal and multiplying the demodulated aural element by 1/P. This is so-called AGC (automatic Gain Control) operation.

Figure 4A:
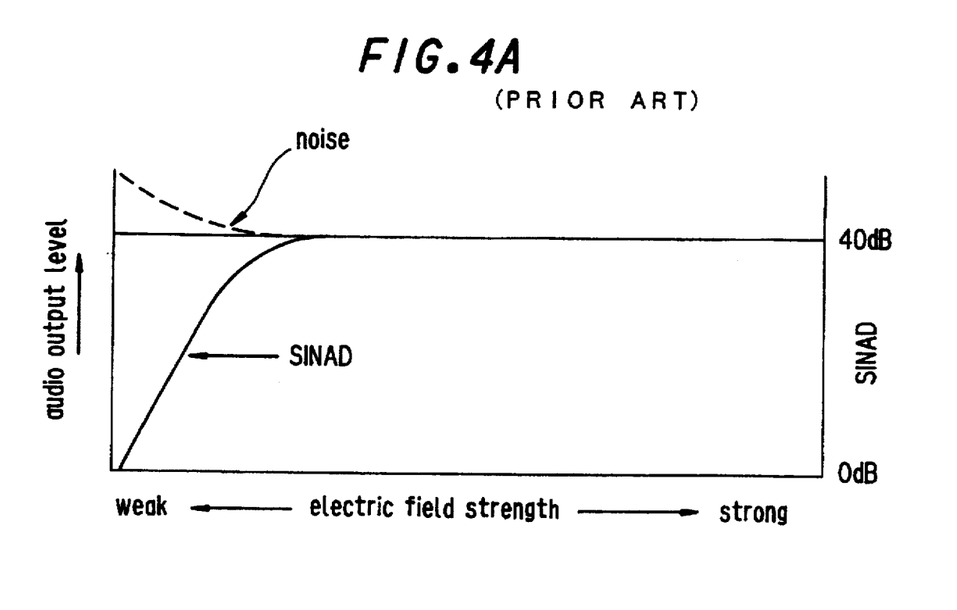
FIG. 4A shows characteristics of audio output and SINAD against electric field strength in a conventional type of tone-in-band receiver.

FIG. 4A shows characteristics of audio output and SINAD (signal plus noise plus distortion to noise plus distortion ratio) against electric field strength. As shown in the figure, audio output at a constant level is obtained because of AGC.

However, in a weak electric field, SINAD is low, so that, if the audio output is provided at a constant level, signals containing heavy noise are outputted at a constant level and it causes hearing discomfort. In addition, sometimes measurement of power of the pilot signal can not be executed correctly, and consequently noise level is raised as indicated by a dotted line in the figure. The phenomenon as described above also occurs when a receiving signal drops out due to Rayleigh fading or the like.

In the AGC operation, measurement of signal power is executed for a pilot signal having passed through a narrow-band filter for a pilot signal as described above, so that 100 ms or more is required only for, for instance, response by the pilot signal filter and a long time is required before the AGC operation is started.

Furthermore when a strong input is received, a pilot filter can not pass the pilot signal through before the AGC operation is locked, and for this reason the AGC operation is not started and the receiving section becomes saturated.

In brief, the conventional type of narrow-band communication apparatus has the following problems. First, an intermittent cycle is controlled or power is turned ON/OFF according to electric field strength detected during intermittent reception in a receiving system to reduce dissipation power in the apparatus, but this technique for reducing dissipation power has been applied only to a receiving system. In the conventional type of narrow-band communication apparatus employing an digital modulation/demodulation, any effective measure for power saving has not been applied to a transmission system although dissipation power in the transmission system is also large. Detection of electric field strength has been applied only to intermittent reception control or to power ON/OFF control, and consequently, circuit efficiency is rather low.

Second, if a search is executed, when executing AFC, in a state where a strong audio signal or data exists near a pilot signal, sometimes the audio signal or data may be mistaken for the pilot signal because of the relation between the filter bandwidth and audio signal shift rate. If the shift rate is set to a large value to overcome this problem, the audio signal can not be transmitted appropriately because there is a limit to the maximum effective bandwidth. If the bandwidth of a pilot signal is made narrower, timing for catching a pilot signal becomes difficult. This makes it necessary to execute a finer search, and consequently, the response speed of the filter becomes slower, and a longer time is required for searching.

Third, when AGC is executed according to the measured power of a pilot signal, an audio output at a constant level is obtained through AGC, but in a weak electric field region, SINAD is low. Hence, signals containing heavy noise are generated at a constant level, which causes serious hearing discomfort. Also pilot signal power can not be measured correctly, so that the noise level is raised, which makes hearing discomfort more serious.

Fourth, in the AGC operation, signal power measurement is executed for a pilot signal having passed through a pilot signal filter, so that a long time is required before the AGC operation is started. When, for instance, a strong input is received, the pilot signal can not pass through the pilot signal filter before the AGC operation is locked, and the AGC operation is not started, so that the receiving section becomes saturated.

SUMMARY OF THE INVENTION

It is an object of the present invention to provide a narrow-band communication apparatus employing digital modulation/demodulation wherein operation of elements constituting the apparatus, operation of which is not required, is stopped according to electric field strength detection as well as to a transmitting or receiving mode to effectively lower power consumption also in the transmitting system, and furthermore electric field strength detection is applied to control of gain in the receiving system for improving circuit efficiency as well as for improving characteristics of the apparatus.

It is another object of the invention to provide a narrow-band communication apparatus which does not generate AFC malfunction due to misrecognition of an audio signal or data for a pilot signal, when executing AFC in a narrow-band communication apparatus or the like employing digital modulation/demodulation, even if a strong audio signal or data exists near the pilot signal.

It is still another object of the present invention to reduce hearing discomfort due to noise when executing AGC operation according to a pilot signal power measurement and also to enable high speed AGC operation without saturating the receiving section in a narrow-band communication apparatus or the like employing digital modulation/demodulation therein.

In a narrow-band communication apparatus according to the present invention, when demodulating the output from a receiving section or modulating the audio input with a digital signal processing means, electric field strength of the output is detected by an electric field strength detecting means, and a power control means provides control over supply of power to, or the operating state of, specified portions of the narrow-band communication apparatus according to the output from the electric field strength detecting means and/or the output from an indicating means for indicating in which of receiving mode or transmitting mode the narrow-band communication apparatus currently is in.

If, for instance, the indicating means does not indicate receiving mode, nor transmitting mode, it is not necessary for both the transmitting system and receiving system to be run, so that operations of the systems are stopped for reducing power consumption. If the indicating means indicates the transmitting mode, operation of the transmitting system is immediately started to enable transmission without any trouble. Furthermore, if the indicating means indicates the receiving mode, and it is determined by the electric field strength detecting means that the electric field strength of a received signal in the receiving section is more than a specified value, the receiving system's operation is enabled so that signals can be received.

As described above, power supply to and operating state of elements constituting an apparatus, operation of which is not required, is controlled according to electric field strength output from a receiving section as well as to whether the apparatus is in transmitting mode or in receiving mode, so that reduction of dissipation power can efficiently be realized not only in the receiving system but also in the transmitting system.

In a narrow-band communication apparatus according to the present invention, gain control for a receiving section is executed by an automatic gain control means according to an automatic gain control signal outputted from a digital signal processing means as well as to a result of detection by an electric field strength detecting means.

When executing gain control only according to an automatic gain control signal outputted through demodulation in a digital signal processing means, sometimes the receiving section may become saturated, for instance, when a strong input is received first, which in turn disables normal receiving. In the narrow-band communication apparatus according to the invention, the electric field strength detecting means is implement, and normal receiving is enabled by providing coarse gain control so that the receiving section will not become saturated before demodulation in the digital signal processing means is started and an accurate automatic gain control signal is outputted. With this feature, electric field strength detection is also applied to gain control for a receiving system, so that circuit efficiency can be improved and also improved characteristics of the apparatus are provided.

In a narrow-band communication apparatus according to the present invention, the receiving section is intermittently run by an intermittent control means to reduce dissipation power in the apparatus.

In a narrow-band communication apparatus according to the present invention, in a digital signal processing means for demodulating the output from a receiving section and outputting a modulated signal for an audio input, after an indicating means indicates the transmitting mode, a specified period of time is measured by a timer circuit, and only a pilot signal is outputted as a modulated signal within the specified period of time by a modulated output control means and sent through a transmitting section. On the other hand, at the receiving side, a frequency control means measures frequency making use of a pilot signal and generates a frequency control signal for automatically controlling frequency in the receiving section as well as in the transmitting section. The frequency control means is previously synchronized to the pilot signal by a synchronism control means within the specified period of time, however, when only a pilot signal is transmitted.

With this feature, automatic frequency control malfunction in which, for instance, an audio signal or data or the like is mistaken for a pilot signal due to the effect of modulation, is eliminated.

In a narrow-band communication apparatus according to the present invention, in a digital signal processing means for demodulating the output from at least a receiving section, pilot signal power included in a receiving signal is measured by a pilot signal power measuring means, and when the measured power of the pilot signal is not more than a specified value, the audio output level is corrected by a level correcting means.

For instance, if the power of a pilot signal becomes very weak due to the effect of fading or the like, the audio output level is corrected, and also an audio output level becomes lower in association with a drop of SINAD in contrast to the fact that audio output is provided at a constant level even in a weak electric field region where SINAD is low in the conventional technology. For this reason, hearing discomfort, caused by the fact that signals containing heavy noise are outputted at a constant level in the conventional technology, is eliminated.

In a narrow-band communication apparatus according to the present invention, in a digital signal processing means for demodulating at least the output from a receiving section, the power of a pilot signal included in a received signal is generally measured by a pilot signal power measuring means. An automatic gain control signal is outputted by an automatic gain control signal output means to an automatic gain control means according to the output of the pilot signal power measuring means for controlling gain in the receiving means, but power in specified channels, each for a receiving signal, is measured by channel power measuring means before the output of the pilot signal power measuring means is obtained. An automatic gain control signal is supplied to the automatic gain control means according to the result of the above measurement for executing gain control in the receiving section.

For instance, even if a strong input is received, power in one channel is measured by the channel power measuring means and gain control is executed so that the receiving section will not become saturated according to the power measurement above. For this reason, the problem in the conventional technology, that the receiving section becomes saturated because the automatic gain control operation is not started, is eliminated, and high speed automatic gain control operation can be realized.

Furthermore in a narrow-band communication apparatus according to the present invention, in a digital signal processing section for demodulating the output from a receiving section and outputting a modulated signal for an audio input, current is detected by a current detecting means, and fluctuation of current detected by the current detecting means is consumed in a load circuit. With this feature, a current consumption in the digital signal processing means can be maintained at a constant level, and degradation of S/N ratio in components such as an A/D converter due to the effect of change in current consumption can be prevented.

Other objects and features of this invention will become understood from the following description with reference to the accompanying drawings.

DESCRIPTION OF THE PREFERRED EMBODIMENTS

Detailed description is made hereinafter for the narrow-band communication apparatus according to the present invention in the order of Embodiment 1 and Embodiment 2.

Figure 1:
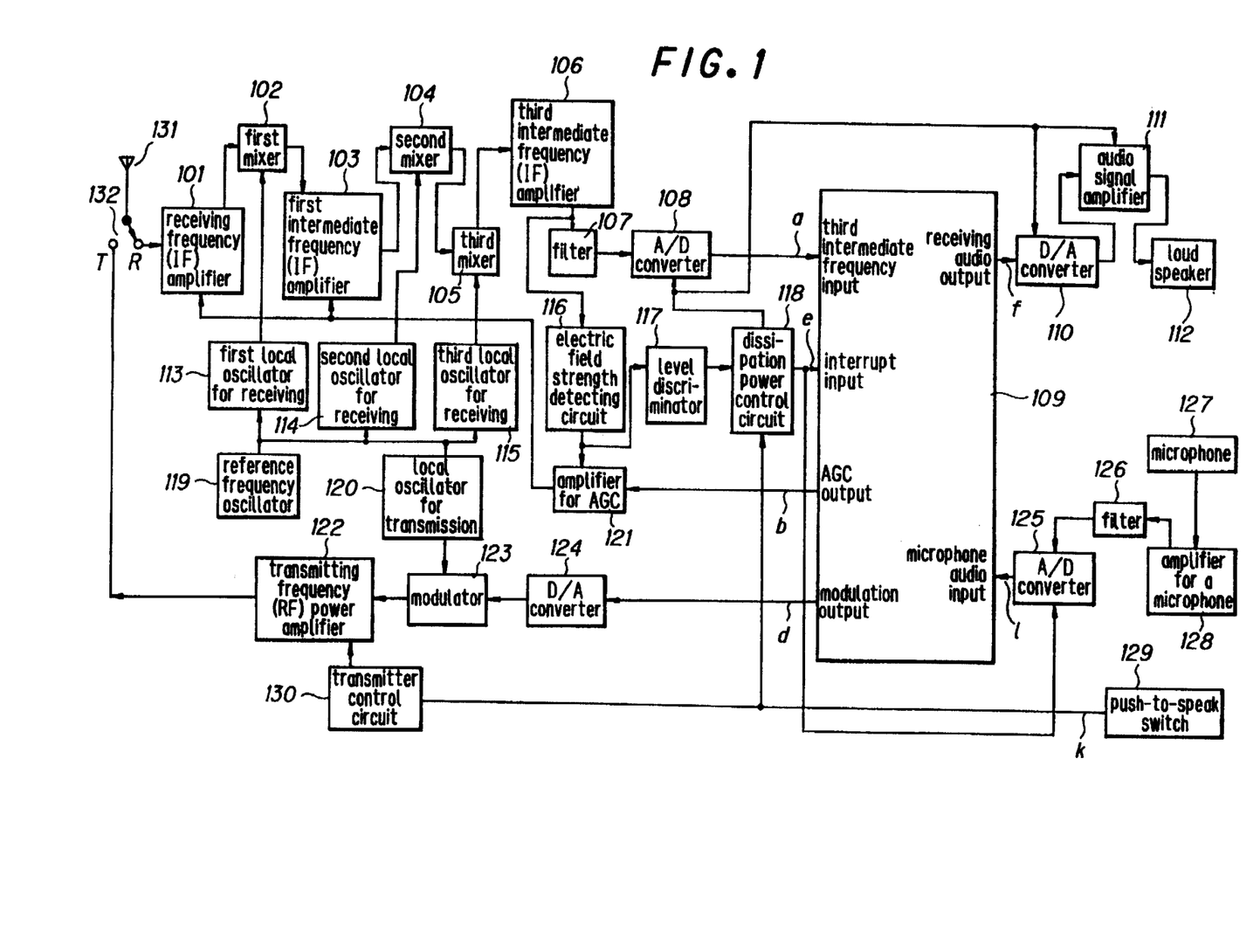
FIG. 1 is a block diagram of a narrow-band communication apparatus according to Embodiment 1 of the present invention.

FIG. 1 is a block diagram of a narrow-band communication apparatus according to Embodiment 1 of the present invention. The narrow-band communication apparatus according to this embodiment is a communication apparatus employing digital modulation/demodulation technology. The apparatus has an electric field strength detecting means based on an analog system and a power control means for controlling dissipation power as a means for reducing dissipation power, and drives the power control means according to (1) an operating mode of the narrow-band communication apparatus or (2) electric field strength direction for reducing dissipation power in the apparatus. Also, an AGC amplifier is driven and controlled according to an output of the electric field strength detecting means to effect coarse AGC so that the receiving section will not be saturated before operation of a signal processing section for executing digital demodulation is started.

In this figure, the narrow-band communication apparatus according to the present embodiment largely comprises, in addition to the means for reducing dissipation power described above, an RF and IF receiving section of a triple super heterodyne receiver, a local frequency generating section for reception, a local frequency generating section for transmission, a reference frequency generating section, a transmitting section, a digital modulation/demodulation signal processing section 109, an audio output section, a microphone audio input section or the like.

The RF and IF receiving section of a triple super heterodyne comprises a received frequency (RF) amplifier 101, a first mixer 102, a first intermediate frequency (IF) amplifier 103, a second mixer 104, a third mixer 105, a third intermediate frequency (IF) amplifier 106, a filter 107, an A/D converter 108, and an amplifier for AGC 121. In the receiving section, an electric wave, received through an antenna 131 and a switch 132, is processed under gain control by the AGC amplifier 121 based on AGC output b from the signal processing section 109 for digital modulation/demodulation according to triple super heterodyne system principles, and is supplied as a third intermediate frequency input a into the signal processing section 109 for digital modulation/demodulation.

The local frequency generating section for reception comprises a first local oscillator 113, a second local oscillator 114, and a third local oscillator 115. The local frequency generating section for transmission is realized by the local oscillator 120. Also, the reference frequency generating section is realized by the reference frequency oscillator 119.

The signal processing section for digital modulation/demodulation is realized by a digital modulator/demodulator 109 employing, for instance, a DSP (Digital Signal Processor) therein.

The audio output section comprises a D/A converter 110, an audio signal amplifier 111, and a loud speaker 112. The microphone audio input section comprises an A/D converter 125, a filter 126, a microphone 127, and an amplifier 128 for a microphone.

The transmitting section comprises a transmitting frequency (RF) power amplifier 122, a modulator 123, a D/A converter 124, a push-to-speak switch (PTT) 129, and a transmitter control circuit 130.

Furthermore the dissipation power reducing means added in the present invention comprises an electric field strength detecting circuit 116, a level discriminator or comparator (an electric field strength comparator) 117, and a dissipation power control circuit 118.

The electric field strength detecting circuit 116 is a circuit for detecting electric field strength of a signal received by the receiving section. In the electric field strength comparator 117, the level of electric field strength of a received signal, detected by the electric field strength detecting circuit 116, is compared to a specified value to make a determination as to whether a received signal is one having an electric field strength less than a specified value or there is no receiving signal, and the result is reported to the dissipation power control circuit 118.

In a narrow-band communication apparatus employing digital modulation/demodulation as in the present embodiment, current in the transmitting/receiving digital modulator/demodulator 109, A/D converter 108, D/A converter 110, and A/D converter 125 is large. Elements constituting the apparatus each require a large current for operating when the apparatus is in the receiving mode or in the transmission mode.

For this reason, the dissipation power controlling circuit 118, according to the present invention, controls supply of power to, or an operating state of, specified portions of the narrow-band communication apparatus according to the detected electric field strength of the received signal by the electric field strength comparator 117 as well as to an instruction by the PTT switch indicating whether the narrow-band communication apparatus is in the receiving mode or in the transmission mode.

Namely if an instruction by the PTT switch 129 indicates that the current operating mode is the receiving mode and at the same time electric field strength in the receiving section is not more than a specified value, it is not necessary for the transmitting/receiving digital modulator/demodulator 109 to operate. It is not necessary for the A/D converter 108, D/A converter 110, audio signal amplifier 111, and A/D converter 125, each around the transmitting/receiving digital modulator/demodulator 109, to operate, so that operation of these elements is stopped to reduce dissipation power.

Then, if an instruction by the PTT switch 129 indicates the transmission mode, the dissipation power control circuit 118 immediately starts operation of the transmitting/receiving digital modulator/demodulator 109 as well as of the A/D converter 125 to enable transmission without any trouble.

Also, if an instruction by the PTT switch indicates the receiving mode, and the electric field strength of a received signal in the receiving section is not less than a specified value, when the electric field strength comparator 117 detects the state, the dissipation power control circuit 118 enables operation of the A/D converter 108, transmitting/receiving digital modulator/demodulator 109, D/A converter 110, and audio signal amplifier 111 to enable receiving by the narrow-band communication apparatus.

It should be noted that, when AGC in the receiving section is executed according to operation (AGC output b) by the transmitting/receiving digital modulator/demodulator 109, if a strong input is received first, the components 101 to 108 in the RF and IF receiving section are saturated, which disables the normal operation for receiving.

To solve this problem, in the present embodiment, gain control is executed by the AGC amplifier 121 according to the AGC output b from the transmitting/receiving digital modulator/demodulator 109 as well as to the level of electric field strength of a received signal detected by the electric field strength detecting circuit 116. Namely, coarse gain control is executed to enable normal operation for receiving before operation of the transmitting/receiving digital modulator/demodulator 109 for demodulation is started and an accurate automatic gain control signal is outputted so that the components 101 to 108 in the receiving section will not be saturated. Thus the problem described above is solved.

The above description assumes that, when the apparatus is in the receiving mode (when an instruction by the PTT switch indicates the receiving mode), the received frequency (RF) amplifier 101, first mixer 102, first intermediate frequency (IF) amplifier 103, second mixer 104, third mixer 105, third intermediate frequency (IF) amplifier 106, filter 107, first local oscillator 113, second local oscillator 114, third local oscillator 115, electric field strength detecting circuit 116, electric field strength comparator 117, dissipation power control circuit 118, reference frequency oscillator 119, local oscillator 120, and AGC amplifier 121 are operating normally, causing these components to operate intermittently for reducing dissipation power in the apparatus is a known technique. This technique can be applied in the present invention.

Figure 2:
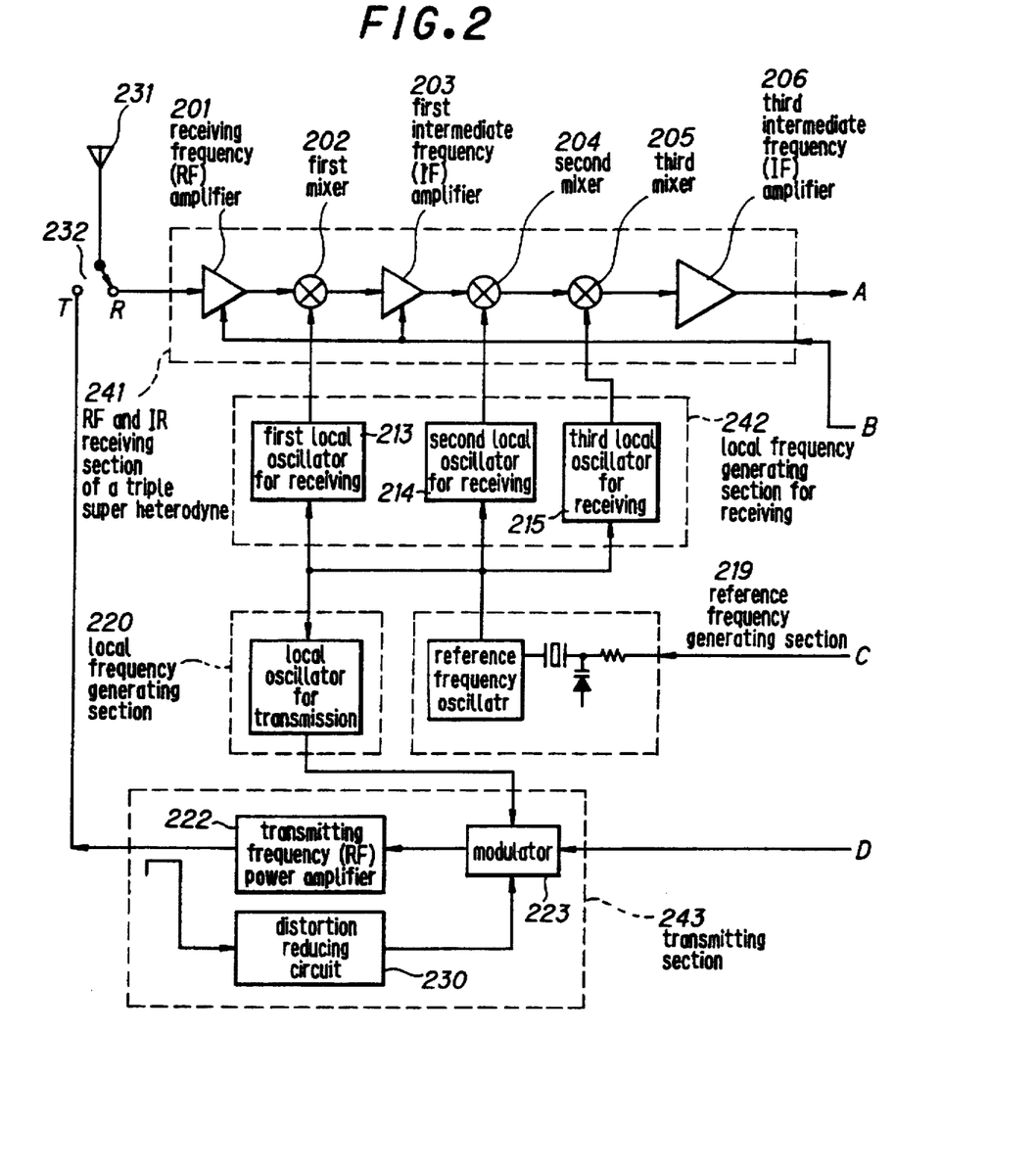
FIG. 2 is a block diagram of a narrow-band communication apparatus according to Embodiment 2 of the present invention.
Figure 3:
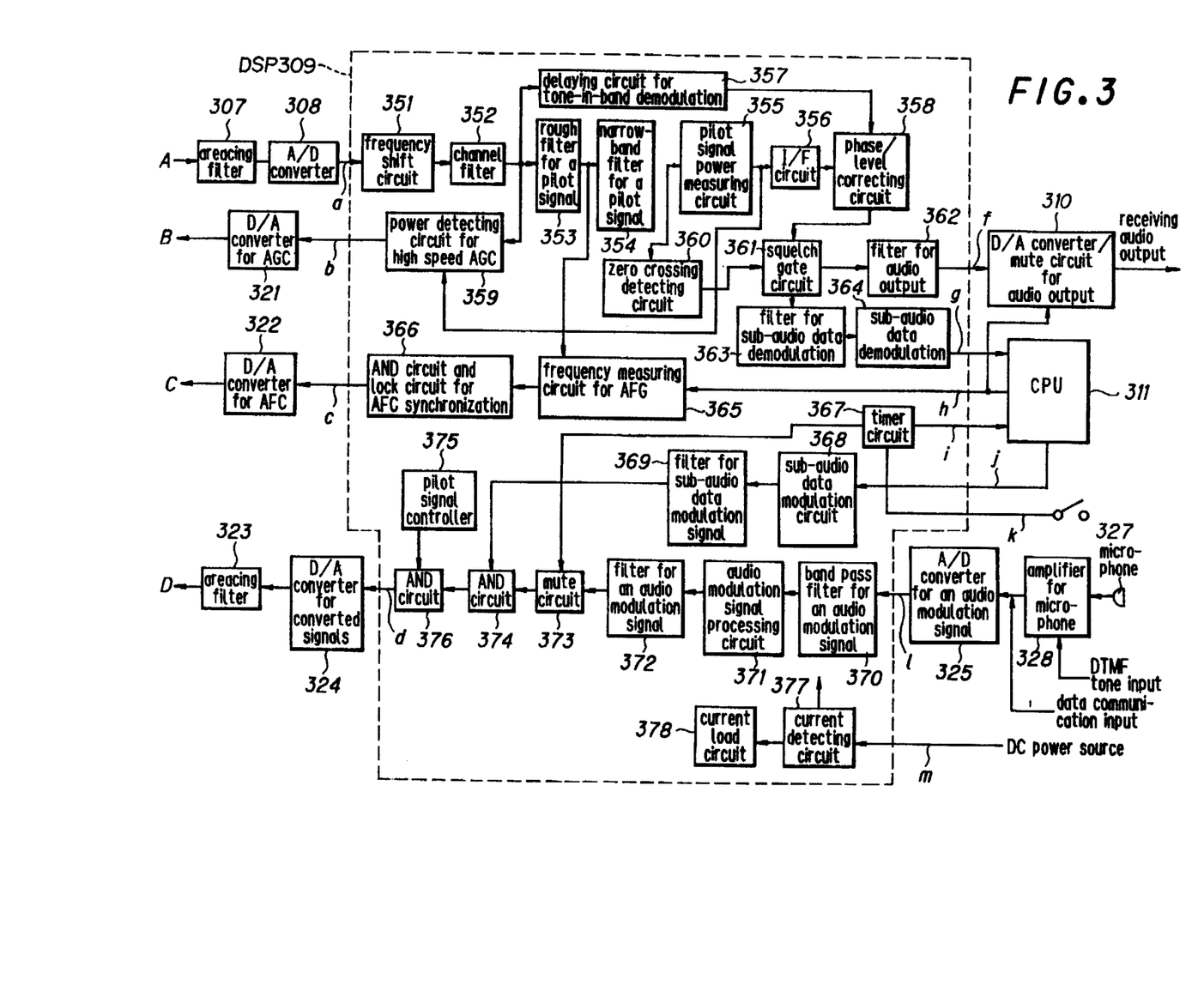
FIG. 3 is a block diagram of a narrow-band communication apparatus according to Embodiment 2 of the present invention.

FIG. 2 and FIG. 3 are block diagrams each of a narrow-band communication apparatus according to Embodiment 2 of the present invention. In FIG. 2 and FIG. 3, the narrow-band communication apparatus according to the present invention largely comprises an RF and IF receiving section of a triple super heterodyne receiver, a local frequency generating section for receiving, a local frequency generating section for transmission, a reference frequency generating section, a transmitting section, a digital modulation/demodulation signal processing section 309, an audio output section, a microphone input section, and a peripheral circuit.

In FIG. 2, the RF and IF receiving section 241 of a triple super heterodyne receiver comprises a received frequency (RF) amplifier 201, a first mixer 202, a first intermediate frequency (IF) amplifier 203, a second mixer 204, a third mixer 205, and a third intermediate frequency (IF) amplifier 206. It should be noted that the third intermediate frequency in this embodiment is 5 KHz.

In the receiving section 241, an incoming waveform received through an antenna 231 and a select switch 232 is received according to triple super heterodyne system principles under gain control (signal B from )by an AGC amplifier 321 providing on AGC output b from a digital modulation/demodulation signal processing section 309, outputs signal A, and supplies it as a third intermediate frequency input a through the filter 307 and the A/D converter 308 to the digital modulation/demodulation signal processing section 309.

The local frequency generating section 242 for receiving comprises a first local oscillator 213, a second local oscillator 214, and a third local oscillator 215. The local frequency generating section 220 for transmission is realized by a local oscillator. Furthermore the reference frequency generating section 219 is realized by a reference frequency oscillator.

All of the local oscillators 213, 214, and 215 in the local frequency generating section 242 lock (synchronize) to the reference frequency oscillator 219 by means of, for instance, PLL (phase locking loop) to supply a local frequency to the receiving section 241.

The local oscillator 220 for transmission is a circuit which generates a local frequency (a carrier frequency or a pilot frequency) for the transmitting section 243. In FIG. 2, the local frequency generating section 242 has an independent configuration, but it may also be used as a PLL for the receiving section 241 in the local frequency generating section 242. Furthermore TCXO (temperature-controlled crystal oscillator), satisfying a legally required value, is available as the reference frequency oscillator 219.

The transmitting section 243 comprises a transmission frequency (RF) power amplifier 222, a modulator 223, and a distortion reducing circuit 230. In response to modulation output d from the digital modulation/demodulation signal processing section 309, a transmitting signal is transmitted through the select switch 232 and the antenna 231 according to the modulated output signal D supplied through a filter 323 and a D/A converter 324.

Also in FIG. 3, the digital modulation/demodulation signal processing section is realized by the transmitting/receiving digital modulator/demodulator 309 employing, for instance, a DSP (Digital Signal Processor). Also the digital modulation/demodulation signal processing section has, as periphery circuits for the transmitting/receiving digital modulator/demodulator 309, the filter 307, the A/D converter 308, the D/A converter 321 for AGC, the D/A converter 322 for AFC, the filter 323 and the D/A converter 324. It should be noted that AFC output from the transmitting/receiving digital modulator/demodulator 309 is supplied via the D/A converter 322 for AFC to the reference frequency generating section 219.

The receiving audio output section comprises a D/A conversion/mute circuit 310 for audio output, an encoder for sub-audio data, a decoder (CPU) 311, and a push-to-talk switch (PTT) 329. It should be noted that in the figure, f indicates receiving audio output, g indicates sub-audio data output, h indicates control input for AFC, i indicates timer output, j indicates sub-audio data input, and k indicates PTT switch input. Herein, the PTT switch 329 is a switch indicating that the narrow-band communication apparatus is in the receiving mode or in the transmission mode, and is set by an operator.

Furthermore, the microphone audio input section comprises an A/D converter 325 for an audio modulation signal, a microphone 327, and an amplifier 328 for a microphone. It should be noted that in the figure, l indicates microphone audio input, and m indicates DC power input. To the amplifier 328 for a microphone is provided, in addition to a microphone audio input from the microphone 327, a DTMF tone input. Furthermore to the A/D converter 325 is supplied, in addition to the output from amplifier 328 for a microphone, a data communication input.

Next, description is made for components inside the transmitting/receiving digital modulator/demodulator 309. In FIG. 3, the transmitting/receiving digital modulator/demodulator 309 comprises a frequency shift circuit 351, a channel filter 352, a coarse filter 353 for a pilot signal, a narrow-band filter 354 for a pilot signal, a pilot signal power measuring circuit 355, an I/F circuit 356, a delaying circuit 357 for tone-in-band demodulation, a phase/level correcting circuit 358, a power detecting circuit 359 for high speed AGC, a zero-crossing detecting circuit 360, a squelch gate circuit 361, a filter 362 for audio output, a filter 363 for a sub-audio data demodulation, a sub-audio data demodulation circuit 364, a frequency measuring circuit 365 for AFC, an AND circuit and a lock circuit 366 for AFC synchronization, a timer circuit 367, a sub-audio modulation circuit 368, a filter 369 for sub-audio data modulation signal, a band pass filter (BPF) 370 for an audio modulation signal, an audio modulation signal processing circuit 371 (Tone-in-Band generating circuit), a filter 372 for an audio modulation signal, a mute circuit 373, an AND circuit 374, a pilot signal controller 375, an AND circuit 376, a current detecting circuit 377, and a current load circuit 378.

The frequency shift circuit 351 shifts the audio (or data) spectrum in TONE IN BAND, but executes processing to return it to the original position. A pass bandwidth in the channel filter 352 is ±2 KHz. A pass bandwidth in the rough filter 353 for a pilot signal is about ±400 Hz. Furthermore, a pass bandwidth in the narrow-band filter 354 for a pilot signal is about ±100 Hz.

The phase/level correcting circuit 358 is a circuit which corrects phase and level with reference to a receiving signal in TONE IN BAND, a so-called pilot signal. The power detecting circuit 359 for high speed AGC is a power detecting unit for high speed AGC and measures all powers in one channel.

The I/F circuit 356 sets an audio output level according to a data table in the I/F circuit 356 based on pilot signal power measurement by the pilot signal power measuring circuit 355 when the pilot signal has substantially weakened transitionally due to, e.g., fading, or when it is determined that the electric field is weak.

The timer circuit 367 is used in a transmission pre-time. The audio modulation signal processing circuit 371 generates TONE IN BAND. The mute circuit 373 is a mute circuit for an audio signal as well as for sub-audio data, and is driven and controlled according to output from the timer circuit 367. The AND circuit 374 adds an audio signal (output from the mute circuit 373) to a sub-audio data modulation signal (output from the filter 369). The AND circuit 376 adds a pilot signal to a modulation signal (output from the AND circuit 374).

Next, description is made for various operations in the narrow-band communication apparatus according to the present invention.

(1) AFC Operation

In the present invention, AFT is realized by measuring frequency by means of making use of a pilot signal (Refer to FIG. 7) inserted at the center of a band of an audio signal.

It should be noted that the digital signal processing means, as defined in this embodiment, is the transmitting/receiving digital modulator/demodulator 309, a timer circuit measuring a specified time after the PTT switch 329 gives an instruction for transmission mode is the timer circuit 367, and the modulation output control means allowing output of only a pilot signal as a modulation signal within the specified period of time is realized with the mute circuit 373, AND circuit 374, pilot signal controller 375, and AND circuit 376.

The frequency control means, generating a frequency control signal (C) for executing automatic frequency control in the receiving section 241 as well as in the transmission section 243 by means of measuring a frequency making use of a pilot signal, is the frequency measuring circuit 365 for AFC. The synchronism control means, synchronizing the frequency measuring circuit 365 for AFC (output therefrom) to the pilot signal within the specified period of time when only a pilot signal is transmitted, is an AND circuit for AFC synchronization and lock circuit 366.

At first, description is made for an operation for transmission. When the PTT switch 329 is turned ON and the apparatus is set in the transmission mode, the timer circuit 367 starts an operation for time measurement. During the specified period of time when this timer circuit 367 executes an operation for time measurement, the timer circuit 367 supplies a control signal to the mute circuit 373 to make the circuit operate. In this step an audio signal, a DTMF tone signal, and a data communication signal are not subjected to modulation. Namely, during a specified period of time since start of transmission when the timer circuit 367 executes time measurement, only a pilot signal is outputted and transmitted as a modulated signal D.

Next, description is made for an operation for receiving. In the receiving side, during a period of time when only the pilot signal is transmitted, a pilot signal is searched, and the output from the frequency measuring circuit 365 for AFC (AFC output signal C) is locked by the AND circuit for AFC synchronization and the lock circuit 366. In this case, once the AFC output signal C is locked, during a period of time when only a pilot signal is transmitted, the AFC output signal C is stopped.

It should be noted that the search for a pilot signal having passed through the coarse filter 353 is executed through the zero-crossing detecting circuit 360, squelch gate circuit 361, sub-audio data demodulation filter 363, sub-audio demodulation circuit 364, an encoder for sub-audio data, and the decoder (CPU) 311.

Then, at the beginning of the next reception, a search for a pilot signal in a normal transmission signal is restarted by each component in the path above. With this operation, it never occurs that an audio signal or data or the like is mistaken for a pilot signal due to the effect by modulation to cause a malfunction in AFC. Also, a pass band of the coarse filter 353 for a pilot filter is ±400 Hz, so that there is no problem concerning timing. Also, even if the output of an AFC output signal C is stopped, the phase/level correcting circuit 358 is working, so that displacement of frequency due to such effects as Rayleigh fading can be compensated.

(2) Operation For Correcting an Audio Output Level

Also in this embodiment, a so-called AGC operation is executed so that constant audio output can be obtained irrespective of electric field strength. Namely, pilot signal power, having passed through the narrow-band filter 354, is measured by the power measuring circuit 355 (a pilot signal power measuring means), and in the power detecting circuit 359 for high speed AGC, a voltage level for AGC is set according to the measured power. The AGC voltage level is supplied as an AGC signal B through the D/A converter 321 to the AGC amplifier 321. Thus, gain control is executed.

Furthermore in this embodiment, in the output side of the pilot signal power measuring circuit 355 is provided the I/F circuit 356, and moreover are provided the delay circuit 357 for TONE IN BAND, and the phase/level correcting circuit (level correcting means) 358 for correcting phase and level of an output signal from the delay circuit 357 according to the output from the I/F circuit 356.

Namely, when pilot signal power becomes very weak due to effects by, for instance, fading, power measurement by the pilot signal power measuring circuit 355 drops to below a specified level, but then a signal according to the data table in the I/F circuit 356 is supplied to the phase/level correcting circuit 358 to correct the audio output level. It should be noted that an operation start level (the specified level described above) for this function may be set to a level seemingly most suited when actual communication is started.

Figure 4B:
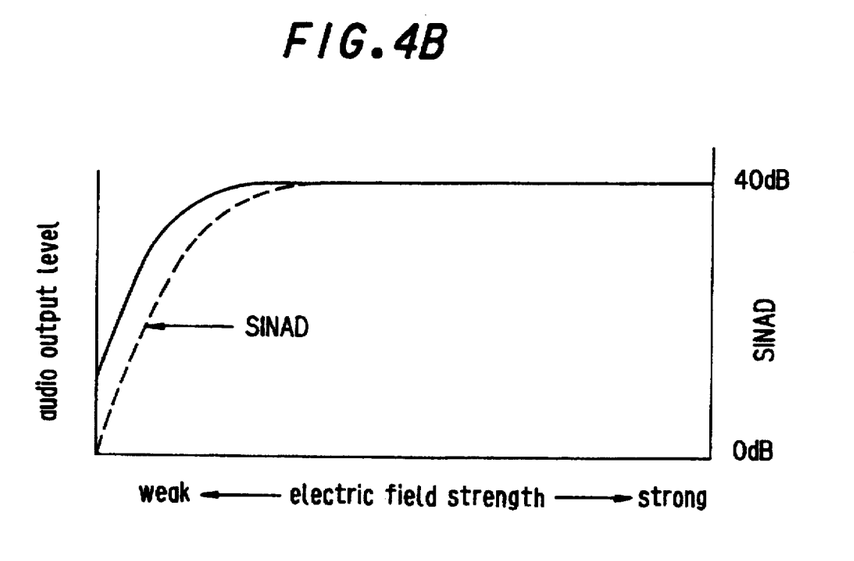
FIG. 4B shows characteristics of audio output and SINAD against electric field strength in Embodiment 2.

For this reason, characteristics of audio output and SINAD (SINAD sensitivity) against electric field strength is as shown in FIG. 4B, and also the audio output level drops in association with drop of SINAD in contrast to the fact that audio level is provided at a constant level even in a weak electric field region where SINAD is low in the conventional technology. With this feature, the problem that a signal including heavy noise elements is outputted at a constant level is solved, and listening is more comfortable.

Figure 5A:
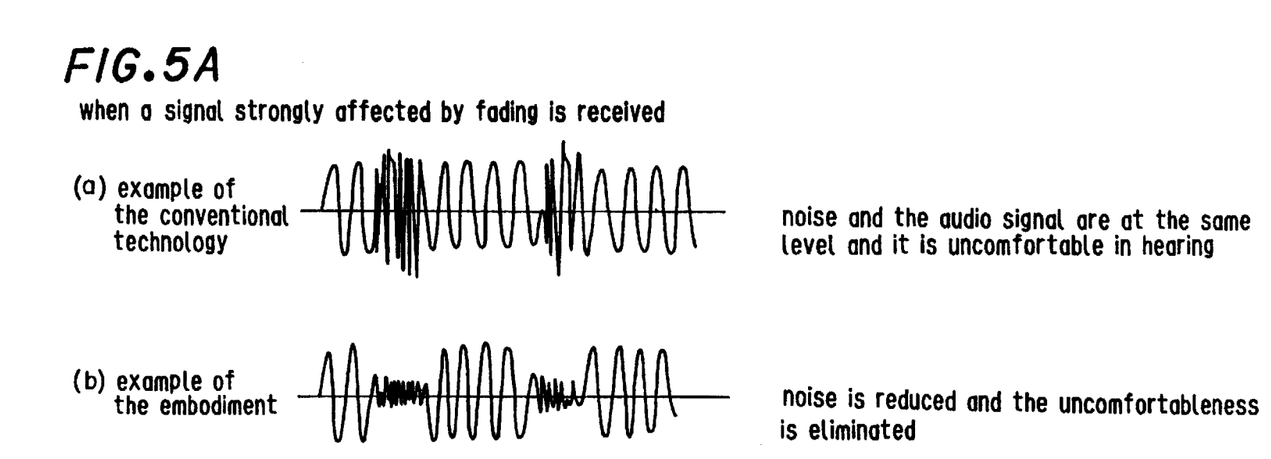
FIG. 5A is a drawing for comparing (1) an example of conventional technology to (b) Embodiment 2 in relation to a receiving audio signal when a signal with strong fading is received.

FIG. 5A shows a comparison of a received audio signal when a signal strongly affected by fading is received to an example of the conventional technology. In the example of the conventional technology (Refer to FIG. 5A-a), noise and the audio signal are at the same level and it is uncomfortable for hearing. In this embodiment (Refer to FIG. 5A-b), however, noise is reduced and discomfort is eliminated.

Figure 5B:
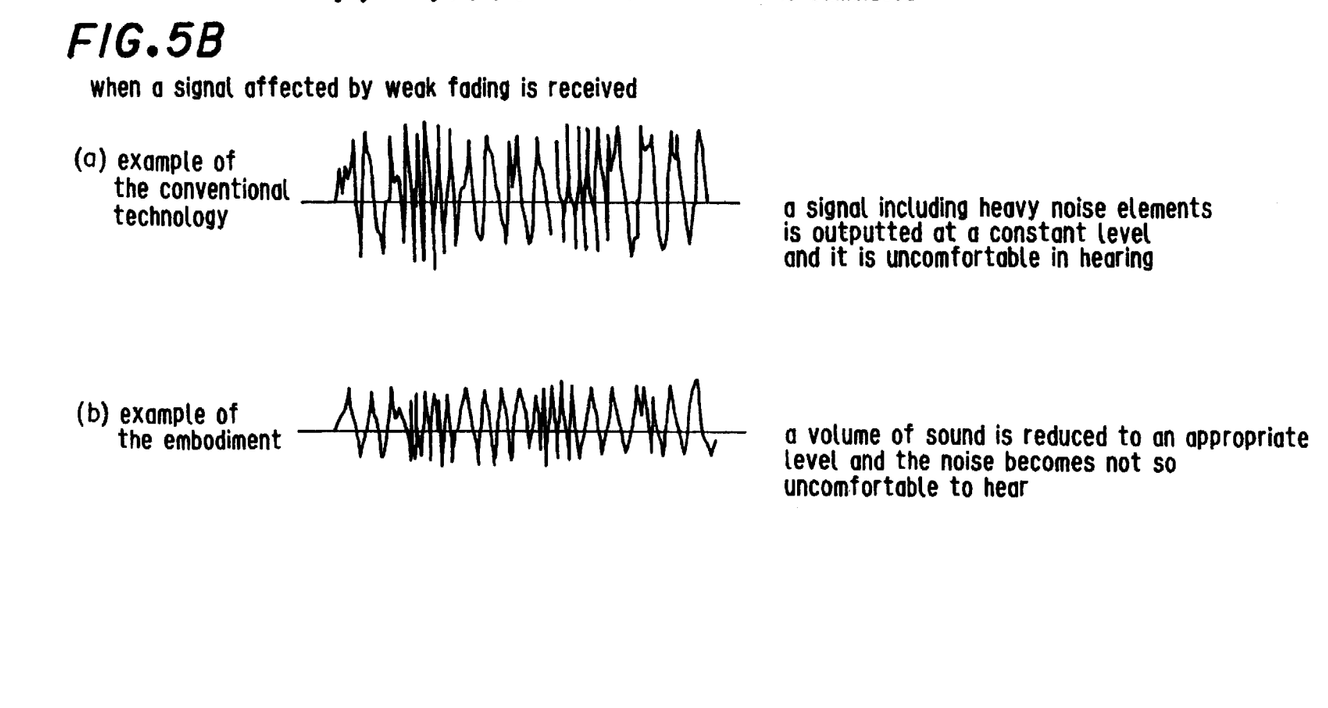
FIG. 5B is a drawing for comparing (a) an example of conventional technology to (b) Embodiment 2 in relation to a receiving audio signal when a signal with weak fading is received.

Furthermore, FIG. 5B shows a comparison of a received audio signal when a signal affected by weak fading is received to an example of the conventional technology. In the example of the conventional technology (Refer to FIG. 5B-a), a signal including heavy noise elements is outputted at a constant level and it is uncomfortable for hearing, but in the present embodiment (Refer to FIG. 5B-b), the volume of sound is reduced to an appropriate level, and also the noise becomes not so uncomfortable.

(3) High Speed AGC Operation

In this embodiment, to realize high speed AGC operation, in addition to the pilot signal power measuring circuit 355 for measuring the power of a pilot signal having passed through the narrow-band filter 354 which is generally installed for AGC operation, a power detecting circuit (channel power measuring means) 359 for high speed AGC to measure power for one channel, the power having passed through the channel filter 352, is provided.

Namely, before the AGC operation is locked (synchronized), the power for one channel having passed through the channel filter 352 is measured by the power detecting circuit 359 for high speed AGC, and an AGC voltage level is set according to the measured voltage. Also after the AGC operation is locked, the pilot signal, having passed through the narrow-band filter 354, is measured by the pilot signal power measuring circuit 355, and the AGC voltage level is set according to the measured power in the power detecting circuit 359.

In the embodiment, the pass band of the channel filter 352 is 4 KHz, which is substantially wider than ±100 Hz, which is a pass band of the narrow-band filter 354, so that response speed in the AGC operation can be improved by several ms.

For instance, even if strong input is received, power for one channel is measured by the power detecting circuit 359, and an AGC voltage level is set according to the measured power to a degree where the receiving section is not saturated. For this reason, the problem in the conventional technology that the receiving section 241 is saturated because the AGC operation is not started is solved, and high speed AGC operation can be realized.

(4) Processing of Power-Supply Current

The narrow-band communication apparatus according to the present embodiment treats signals having power in the range of from several V to several mV. In addition, a S/N ratio of 40 dB or more is required to an input signal with a power of several mV.

For instance, if a receiving signal is a weak signal, an interface input level in an A/D converter is at a level of several mV. The level of microphone audio, input by the microphone 327 in a transmission system, is around several mV. Furthermore, if a received signal is a strong signal, an interface input level in an A/D converter is around 2V, and modulation output to a transmitting section is also around 2V.

So it is assumed herein that the maximum signal level is 2 V and the minimum signal level is 2 mV. Also, if it is assumed that the S/N ratio of 40 dB is secured at the minimum signal level, the dynamic range D of the maximum signal level as well as of a noise level is expressed by the following equation;

$$D=20 \log (2/2\times10^{-3})+40=100 \; dB$$

For this reason, 100 dB or more is required as a dynamic range D of the maximum signal level and noise level. It is difficult to realize this value even if there is a slight cause, such as power noise.

In this embodiment, change of current consumed in a digital circuit is detected by the current detecting circuit 377, and a factor of current caused by fluctuation is dissipated by the DC current load circuit 378 to keep the dissipated current in the transmitting/receiving digital modulator/demodulator 309 at a constant level. Hence, the S/N ratio in the A/D converter due to change in current consumption is prevented.

It should be noted that in this embodiment the transmitting/receiving digital modulator/demodulator 309 is realized by a digital signal processor (DSP), and the operations (1) to (4) described above are realized in software in the DSP.

As described above, with the narrow-band communication apparatus according to the present invention, when demodulation of the output from a receiving section and modulation of audio input are executed by a digital signal processing means, electric field strength of the output from a receiving section is detected by an electric field strength detecting means, while the supply of power to or operating state of specified portions of the narrow-band communication apparatus is controlled according to the output from the electric field strength detecting means and/or to the output from an indicating means for indicating whether the narrow-band communication apparatus is in the receiving mode or in the transmission mode. Thus, supply of power to, or operating state of, apparatus components, operation of which is not required, is controlled according to detected electric field strength in the output from the receiving section as well as to an operating mode of transmission or receiving. Thus, it is possible to provide a narrow-band communication apparatus which can reduce dissipation power not only in the receiving system but also in the transmission system.

Also, when gain control for a receiving section is executed according to only an automatic gain control signal outputted through demodulation processing in a digital signal processing means, sometimes normal operation for receiving is disabled because the receiving section is saturated, for instance, when a strong input is received at first. With the narrow-band communication apparatus according to the present invention, however, gain control for a receiving section is executed by an automatic gain control means according to an automatic gain control signal outputted from a digital signal processing means as well as a result of detection by an electric field strength detecting means. Thus, it is possible to provide a narrow-band communication apparatus which enables reception by executing coarse gain control preventing the receiving section from being saturated before demodulation processing in the digital signal processing means is actuated and an accurate automatic gain control signal is outputted. This improves circuit efficiency and provides improved characteristics by applying detected electric field strength also for gain control in the receiving system.

With the narrow-band communication apparatus according to the present invention, a receiving section is operated intermittently by a intermittent control means, so that dissipation current in the apparatus can be reduced.

With the narrow-band communication apparatus according to the present invention, after an indicating means indicates the transmission mode in a digital signal processing means for outputting a demodulation signal for output from a receiving section and a modulation signal for audio input to the receiving section, a specified time is measured by a timer circuit. Only a pilot signal is transmitted as an output of a modulation signal within the specified period of time through the transmitting section by a modulation output control means. On the other hand, in the receiving side, frequency is measured by a frequency control means by making use of a pilot signal to generate a frequency control signal for executing automatic frequency control in the receiving section as well as in the transmitting section. However, a frequency control means is synchronized previously by a synchronism control means to the pilot signal during a specified period of time when only a pilot signal is transmitted. For this reason, malfunction in automatic frequency control, such as mistaking an audio signal or data or the like for a pilot signal due to modulation effect never occurs.

With the narrow-band communication apparatus according to the present invention, in a digital signal processing means for demodulation of at least the output from a receiving section, the power of a pilot signal included in a received signal is measured by a pilot signal power measuring means, and an audio output level is corrected by a level correcting means when the measured power of the pilot signal is less than a specified value. Hence, discomfort in hearing experienced in the conventional technology, for instance, when a pilot signal is considerably weakened due to fading or the like, can be eliminated.

With the narrow-band communication apparatus according to the present invention, in a digital signal processing means for demodulating at least the output from a receiving section, the power of a pilot signal to be included in a receiving signal is measured by a pilot signal power measuring means. An automatic gain control signal is outputted by an automatic gain control signal output means to an automatic gain control means according to the measurement described above to execute gain control for the receiving section. However, received signal power for specified channels is measured by a channel power measuring means before measurement by the pilot signal power measuring means is obtained, and an automatic gain control signal is outputted to an automatic gain control means according to the measurement to execute gain control for the receiving section. For this reason, the problem as observed in the conventional technology that the receiving section is saturated because the automatic gain control operation is not started is solved, and high speed automatic gain control operation can be realized.

With the narrow-band communication apparatus according to the present invention, in a digital signal processing means for demodulating the output from a receiving section and outputting a modulation signal for audio input, current consumption is detected by a current detecting means, and a factor of the current caused by fluctuation and detected by a current detecting means is consumed by a load circuit. Thus, current consumption in the digital signal processing means can be kept at a constant level and the S/N ratio in the component such as an A/D/D converter due to change in the dissipation current can be prevented.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. a narrow-band communication apparatus comprising:

a receiving section;

a digital signal processor for demodulating an output from said receiving section and outputting a modulation signal for an audio input;

a transmitting section for transmitting an electric wave according to a modulation signal output from said digital signal processor;

an electric field strength detector for detecting electric field strength in an output from said receiving section;

an indicator for indicating whether said narrow-band communication apparatus is in a receiving mode or in a transmission mode; and a power controller for controlling supply of power to, or an operating state of specified portions in, said narrow-band communication apparatus according to the output from said electric field strength detector as well as from said indicator.

2. A narrow-band communication apparatus according to claim 1, further comprising an intermittent controller for intermittently operating said receiving section.

3. A narrow-band communication apparatus according to claim 1, further comprising an automatic gain controller for executing gain control for said receiving section according to an automatic gain control signal outputted from said digital signal processor and a result of detection by said electric field strength detector.

4. A narrow-band communication apparatus according to claim 3, further comprising an intermittent controller for intermittently operating said receiving section.

* * * * *